United States Patent
Suzuki

(10) Patent No.: US 6,621,089 B1
(45) Date of Patent: Sep. 16, 2003

(54) RETICLE-FOCUS DETECTOR, AND CHARGED-PARTICLE-BEAM MICROLITHOGRAPHY APPARATUS AND METHODS COMPRISING SAME

(75) Inventor: Kazuaki Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/694,089

(22) Filed: Oct. 19, 2000

(30) Foreign Application Priority Data

Oct. 19, 1999 (JP) .......................................... 11-297510

(51) Int. Cl.$^7$ ............................. G03F 9/00; G01B 11/00
(52) U.S. Cl. ................................ 250/492.2; 250/492.3; 250/491.1; 250/494.1; 250/396 R; 250/397
(58) Field of Search .......................... 250/492.2, 492.3, 250/491.1, 494.1, 396 R, 397

(56) References Cited

U.S. PATENT DOCUMENTS

| | | | |
|---|---|---|---|
| 4,383,757 A | * | 5/1983 | Phillips ....................... 355/53 |
| 4,558,949 A | * | 12/1985 | Uchara et al. ............... 356/152 |
| 5,796,467 A | | 8/1998 | Suzuki ......................... 355/53 |
| 5,894,056 A | * | 4/1999 | Kakizaki et al. ............... 430/5 |
| 6,027,843 A | * | 2/2000 | Kojima et al. ................ 430/30 |

OTHER PUBLICATIONS

Rai–Choudhury, ed., *Handbook of Microlithography, Micromaching and Microfabrication,* vol. 1, SPIE Press, Bellingham, Washington, 184–186, 1997.

* cited by examiner

*Primary Examiner*—John R. Lee
*Assistant Examiner*—Nikita Wells
(74) *Attorney, Agent, or Firm*—Klarquist Sparkman LLP

(57) ABSTRACT

The thickness of the reticle used in charged-particle-beam (CPB) microlithography is a few microns at most. Hence, the reticle bends easily and flexes when subject to vibration, causing instability in reticle axial height position relative to the projection-lens system, and errors in image focus, rotation and magnification. Apparatus are disclosed that include a device for detecting the axial height position of the reticle. The device produces one or more beams of light (IR to visible) to strike the reticle at an oblique (not 0 degrees) angle of incidence, detects light reflected from the reticle surface, and detects lateral shifts of the reflected light as received by a height detector. Hence, reticle focus is detected easily and in real time. Multiple detection beams can be used, thereby allowing detection of both axial height position and inclination of the reticle with high accuracy. Reticle-position data can be used to regulate operation of, e.g., an exposure meter.

10 Claims, 7 Drawing Sheets

RETICLE-FOCUS DETECTOR, AND CHARGED-PARTICLE-BEAM MICROLITHOGRAPHY APPARATUS AND METHODS COMPRISING SAME

FIELD OF THE INVENTION

This invention pertains to microlithography (projection-transfer of a pattern, defined by a reticle or mask, to a suitable substrate using an energy beam). Microlithography is a key technology used in the manufacture of microelectronic devices (e.g., semiconductor integrated circuits), displays, and the like. More specifically, the invention pertains to microlithography performed using a charged particle beam such as an electron beam or ion beam. Even more specifically, the invention pertains to detecting and adjusting the axial height position of the reticle ("reticle focus") relative to a projection-lens system used to project an image of an illuminated region of the reticle onto the substrate;

BACKGROUND OF THE INVENTION

Several techniques currently are used to perform charged-particle-beam (CPB) microlithography. One conventional technique is the so-called cell projection or character projection, in which a portion of a pattern that is repeated many times in the pattern is defined on a reticle. The reticle includes an arrangement of beam-transmissive regions and beam-blocking regions that, as an illumination beam passes through the reticle, forms a "patterned beam" or "imaging beam." An example is a reticle defining a highly repeated portion of an overall pattern for a memory chip. To expose a single die on a wafer or other substrate, the reticle is exposed many times, each time at a different location in the die so as to re-form the entire pattern contiguously on the die. Unique portions of the die pattern (i.e., portions that are not composed of repetitive pattern-portion units and that typically are located mainly at the periphery of the die) can be exposed using a variable-shaped beam, wherein a charged particle beam of a desired size and shape is obtained by selectively blocking portions of the beam from propagating to the substrate. These techniques are described, for example, in Rai-Choudhury (ed.), *Handbook of Microlithography, Micromachining, and Microfabrication*, Vol. 1, SPIE Press, 1997, p. 184, §2.5.6).

In the cell projection technique summarized above, each of the highly repeated portions exposed per single "shot" of the beam typically has an area of approximately (5 $\mu$m) square. Hence, hundreds to thousands of shots are required to expose a single die, which adversely affects throughput greatly. As the size and density of microelectronic devices has continued to increase, throughput tends to decrease progressively.

Accordingly, considerable interest lies in developing CPB microlithography methods and apparatus that can achieve higher throughput. One possible technique is to expose the entire die pattern from a reticle in a single shot. Unfortunately, this technique requires enormous CPB optical systems that are extremely difficult and expensive to manufacture, that exhibit excessive aberrations (especially off-axis), and that are extremely difficult to provide with a reticle (CPB reticles of the required size are extremely difficult or impossible to fabricate using conventional methods). Consequently, development has progressed toward development of systems that do not expose the entire reticle pattern in one shot, but rather expose sequential regions of the pattern in a stepping or scanning manner.

Typically, in these methods, a highly accelerated charged particle beam is used to improve resolution and reduce space-charge effects. Unfortunately, highly accelerated charged particle beams exhibit problems such as excessive reticle heating by absorbed particles of the beam. Such heating causes reticle deformation, which causes deformations of the pattern being transferred to the substrate.

To alleviate this problem, a scattering-contrast technique is used in which no actual charged-particle absorption occurs in the reticle. Rather, a scattering aperture is used, wherein the degree of charged-particle blocking by the scattering aperture varies with differences in the scattering angle of the particles, thereby generating contrast. Suitable reticles include scattering-stencil reticles (in which a pattern is defined by a corresponding pattern of apertures in a particle-scattering membrane), and scattering-membrane reticles (in which a pattern is defined by a corresponding pattern of particle-scattering bodies arranged on a particle-transmissive membrane). In any event, substantially all reticles used for CPB microlithography are reinforced structurally by "struts" extending between subfields or other exposure units of the reticle.

Unfortunately, whenever CPB microlithographic pattern transfer is performed using methods as described above, problems of pattern-image defocus (blur), magnification deviations, and image rotation tend to occur at levels exceeding specifications. The respective magnitudes of these problems vary in repeated exposure experiments using the same reticle. As a result, yields of microelectronic devices drop to unacceptable levels and manufacturing costs are increased.

One proposed method for achieving accurate correction of positional relationships between the reticle and the projection-optical system is disclosed in U.S. Pat. No. 5,796,467. According to that patent, multiple exposures are performed using a scanning type CPB microlithography apparatus. During the scanning exposures, the reticle and wafer are moved in mutually opposite directions. The optimal image plane variation obtained from the exposures is stored in a memory as a variation of the positional relationship between the reticle and the projection-optical system. An actual exposure is performed while making a correction according to the coordinates in the scanning direction. Unfortunately, results obtained using that method were not entirely satisfactory.

SUMMARY OF THE INVENTION

In view of the shortcomings of the prior art as summarized above, an object of the present invention is to provide charged-particle-beam microlithography apparatus that detect the axial height position of the reticle in a manner resulting in reduced defocus (blur) of the pattern image.

To such end, and according to a first aspect of the invention, charged-particle-beam (CPB) microlithography apparatus are provided, of which a representative embodiment comprises an illumination-optical system, a projection-lens system, and a reticle-focus-detection device (i.e., a device for detecting the axial height position of the reticle). The illumination-optical system is situated and configured to illuminate a region of a pattern-defining reticle with a charged-particle illumination beam passing through the illumination-optical system. The projection-optical system is situated and configured to projection-transfer an image of the illuminated region of the reticle onto a corresponding region of a sensitive substrate using an imaging beam passing through the projection-optical system. The reticlefocus-detection device is situated and configured to detect an axial height position of the reticle relative to the projection-lens system. The reticle-focus-detection device can be used to detect an axial height position of a stencil reticle or a scattering-membrane reticle relative to the projection-lens system.

Compared to a conventional apparatus with which exposure is performed after determining a correction of reticle position relative to the projection-lens system, an apparatus according to the invention as summarized above can provide real-time data on reticle axial height position relative to the projection-lens system. Hence, higher-accuracy projection exposure of the reticle pattern onto the substrate can be performed with high precision.

The reticle-focus-detection device comprises a focus-detection-beam source situated and configured to produce a focus-detection light beam and to direct the focus-detection beam onto a surface of the reticle such that the focus-detection beam is incident on the reticle at an oblique angle of incidence. The device also includes a height detector situated and configured to detect light, of the focus-detection beam, reflected from the reticle surface and to produce a corresponding focus-detection (height-detection) signal. In this context, the reticle can be of a type including a reticle membrane and support struts extending from non-pattern-defining regions of the reticle membrane. With such a reticle, the focus-detection-beam source can be configured to produce multiple focus-detection light beams directed at the reticle surface in a manner in which the focus-detection light beams are incident on the non-pattern-defining regions of the reticle membrane.

The reticle-focus-beam source can be configured to direct the focus-detection beams to the reticle, and the height detector can be configured to produce the focus-detection signal, only whenever the non-pattern-defining regions of the reticle membrane are being illuminated by the focus-detection beams. In this manner, by obtaining a focus-detection signal in synchrony with irradiation of non-pattern-defining regions of the reticle (e.g., membrane regions at which the support struts are located), an accurate height-detection (focus-detection) signal is obtained without interference generated by light reflected from apertures in the membrane.

The height detector desirably comprises a light-receiving surface including a light sensor. In such an instance, the light sensor can be configured to measure a lateral displacement of the focus-detection light beam on the light-receiving surface. For example, the light sensor can be a one-dimensional light-sensor array, a two-dimensional light-sensor array, or a point-sensitive detector (PSD), wherein a plurality of these sensors is arranged on the light-receiving surface.

The apparatus desirably includes a reticle stage to which the reticle is mounted and a substrate stage to which the substrate is mounted for exposure. The reticle stage and substrate stage usually are moved in opposite directions during exposure of the reticle pattern onto the substrate. With such a configuration, the focus-detection-beam source can be configured to produce multiple focus-detection light beams directed at the reticle surface. Use of multiple beams allows measurements to be made simultaneously at multiple locations on the reticle. This allows detection not only of axial height position of the reticle but also of inclination of the reticle relative to an optical axis of the projection-lens system.

According to another aspect of the invention, methods are provided for performing projection-transfer of a pattern, defined on a reticle, to a sensitive substrate using a charged particle beam. The reticle is illuminated with a charged-particle illumination beam to produce an imaging beam, and the imaging beam is passed through a projection-lens system to the substrate. To detect a focus condition (axial height condition) of the reticle, a focus-detection beam of light is provided, directed at an oblique angle of incidence to a surface of the reticle to produce a reflected beam. The reflected beam is detected using a height detector configured to produce a corresponding height-detection signal from the detected light. The height-detection signal is processed to produce data concerning an axial height position of the reticle relative to the projection-lens system. The reticle typically comprises a reticle membrane and support struts extending from non-pattern-defining regions of the reticle membrane. In such an instance, multiple focus-detection beams can be directed at the reticle surface in a manner in which the focus-detection light beams are incident on the non-pattern-defining regions of the reticle membrane.

The foregoing and additional features and advantages of the invention will be more readily apparent from the following detailed description, which proceeds with reference to the accompanying drawings.

BRIEF DESCRIPTION OF THE DRAWINGS

FIG. 7(a) is a reticle in which individual square subfields (intended to be exposed one at a time) are separated from one another by minor struts, and FIG. 7(b) is a reticle in which the subfields (intended to be exposed in a scanning manner) are longitudinally extended in a beam-deflection direction.

DETAILED DESCRIPTION

General Considerations

The invention is based on an analysis of the following problems experienced with the types of membrane reticles summarized above:

(1) Bending of the reticle membrane caused by gravity is greater than bending experienced by a conventional reticle.

(2) Vibration of the reticle in an axial direction is caused by the movements of the reticle stage performed to move the desired region of the reticle pattern within the visual field of the CPB illumination-optical and projection-optical systems.

(3) Especially in the case of pattern-transfer type CPB microlithography apparatus, the demagnification ratio at which projection occurs is kept to values of 1/(several ones) to avoid making the reticle extremely large. As a result, the variation in position of the reticle in the axial direction has an effect on the focusing performance of the image on the wafer that cannot be ignored.

The present invention is based on the discovery that these problems cannot be corrected entirely in a satisfactory manner using correction values measured prior to exposure. Rather, it is necessary to correct positional variations of the reticle in real time during exposure.

In conventional CPB microlithography, stencil-type reticles frequently are used. Typically, the reticle comprises a membrane made of a metal that absorbs the charged particle beam. The membrane, having a thickness of several tens of micrometers, defines openings that, in combination with remaining portions of the membrane, define the pattern. The mechanical rigidity of such a reticle is relatively high. Also, the demagnification of the image as projected normally is 1/(several tens). As a result, the effects of reticle deformation in the axial direction on image focusing on the wafer usually can be ignored, and there is no need to detect reticle focus. The present invention originates in a phenomenon that could not be predicted from this conventional apparatus.

The invention is described below in the context of representative embodiments. However, it will be understood that the invention is not limited to those embodiments.

Representative Embodiment

Figure 1:
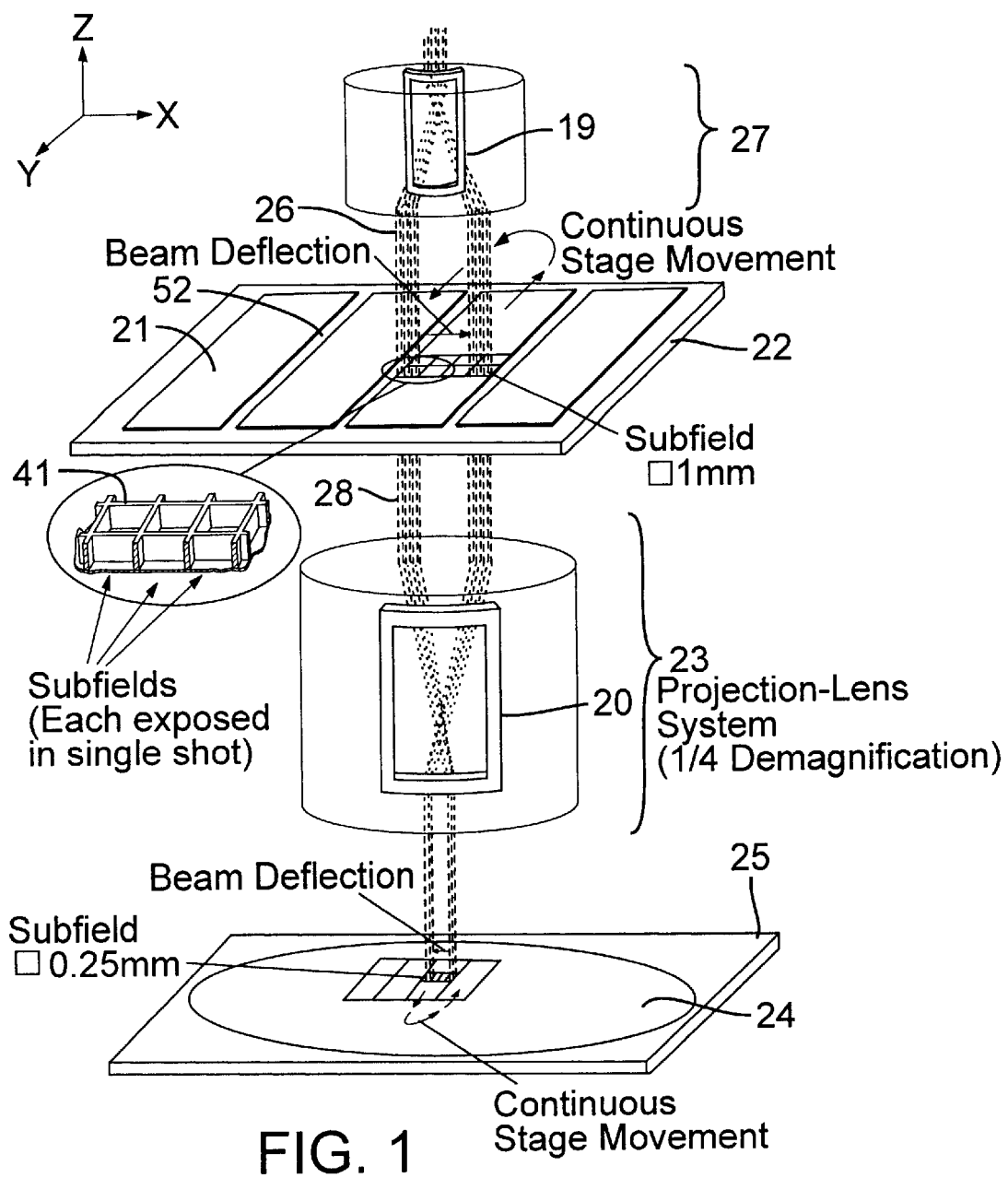
FIG. 1 is an oblique elevational diagram of certain aspects of a charged-particle-beam (CPB) microlithography apparatus according to the invention.

A CPB microlithography apparatus according to this embodiment is depicted in FIG. 1. This embodiment is described in the context of using an electron beam as an exemplary charged particle beam. However, it will be understood that the general principles readily can be applied to other types of charged particle beams, such as an ion beam.

In FIG. 1, a reticle 21 is mounted on a reticle stage 22 that is movable in two dimensions (X- and Y-dimensions). Downstream of the reticle 21, a wafer 24 (constituting a "sensitive," or resist-coated substrate) is mounted on a wafer stage 25 that also is movable in two dimensions (X- and Y-dimensions). Between the reticle 21 and the wafer 24 is a projection-lens system 23, and upstream of the reticle 21 is an illumination-optical system 27. The illumination-optical system 27 trims an electron beam 26 to a square transverse profile and causes the beam (as an "illumination beam") to strike the reticle 21 perpendicularly to the plane of the reticle 21. On the reticle 21, the pattern region that can be transferred in a single shot is termed a "subfield." The subfield typically has a size of (1 mm) square on the reticle 21. From the reticle 21, the beam passes (as an "imaging beam") through the projection-lens system 23 to the wafer 24. The illumination-optical system 27 and the projection-lens system 23 each include at least one deflector 19, 20, respectively.

Figure 2:
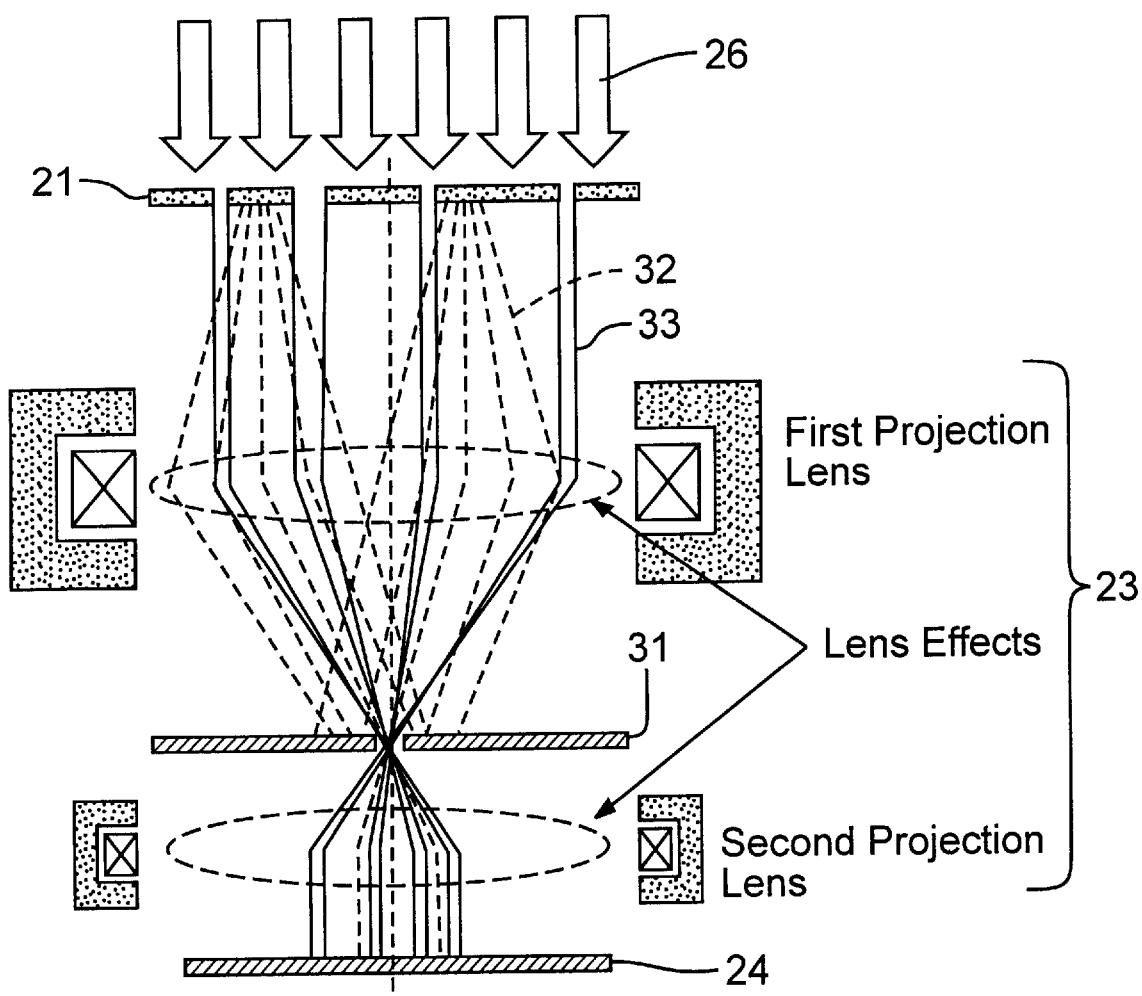
FIG. 2 is an elevational schematic depiction of certain aspects of the projection-lens system and beam trajectories of the FIG. 1 embodiment.

The reticle 21 used in the configuration of FIG. 1 is a "scattering-stencil" reticle in which beam-transmissive apertures are defined in a CPB-scattering membrane material. FIG. 2 depicts the reticle 21 being illuminated from upstream by the electron beam ("illumination beam" 26). The illumination beam passes readily through the apertures in the reticle 21 but is scattered by passage through the membrane portion of the reticle. The scattered electrons 32 (indicated by broken lines) in the resulting "imaging beam" are blocked by a scattering aperture 31 in the projection-lens system 23 from propagating further downstream to the surface of the wafer 24. Electrons (indicated by solid lines in the figure) passing freely through the apertures in the reticle 21 propagate as the imaging beam to the surface of the wafer 24 and expose a resist applied to the surface of the wafer 24. By way of example, if the demagnification ratio of the projection-lens system 23 is ¼ and the size of a subfield on the reticle 21 is (1 mm) square, then the size of a corresponding subfield on the wafer 24 is (250 $\mu$m) square.

Figure 3:
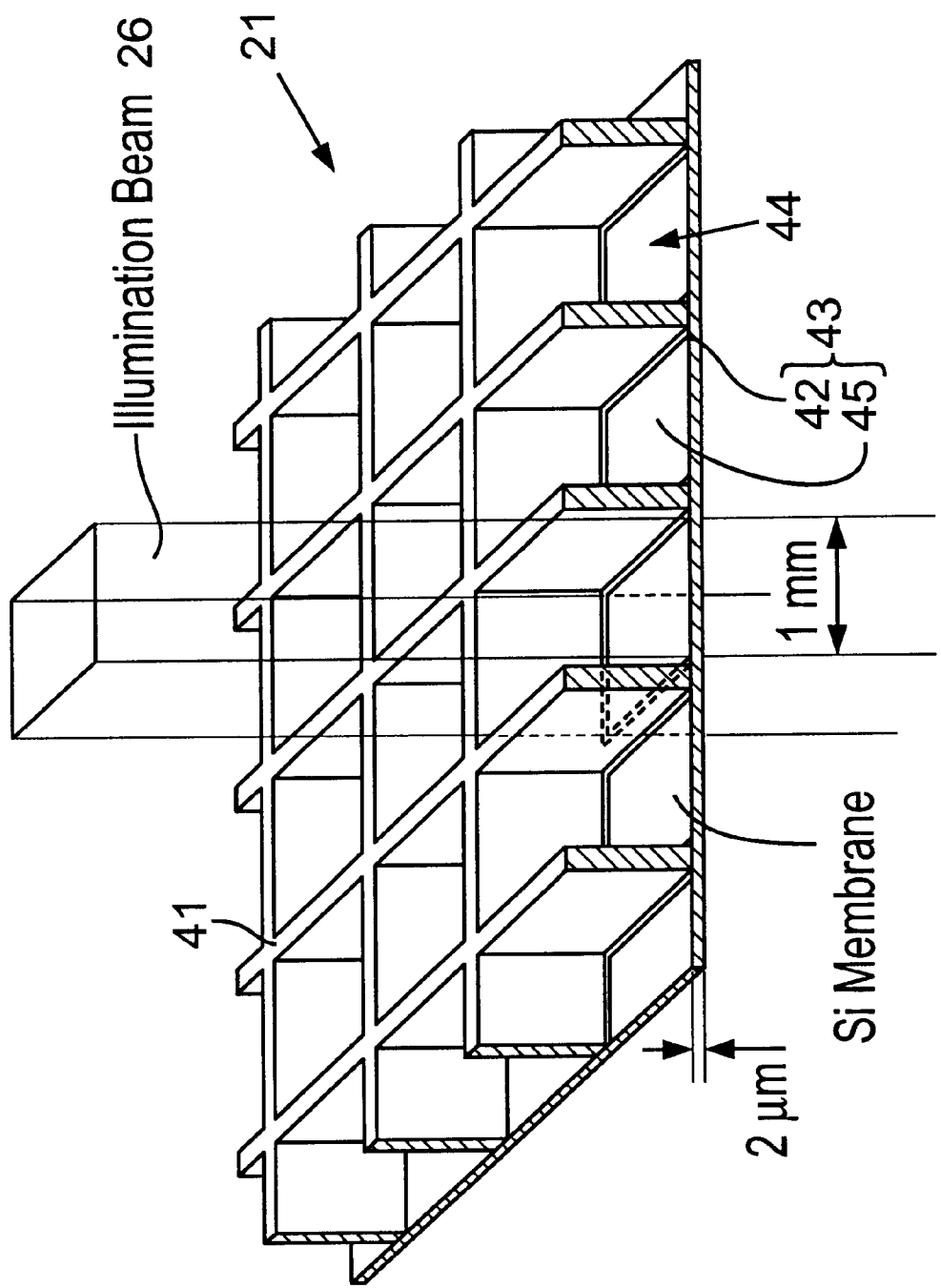
FIG. 3 is an oblique elevational diagram of certain aspects of a reticle as used with the FIG. 1 embodiment.

Returning to FIG. 1, the illumination beam 26 illuminating the reticle 21 is moved laterally (to the left and right in the figure) in an appropriate manner by the deflector 19 of the illumination-optical system 27. As shown in FIG. 1 (see also FIG. 3), the reticle 21 includes a grid structure formed of "minor struts" 41. As the illumination beam 26 is illuminating a subfield on the reticle 21, the illumination beam 26 is trimmed and blanked appropriately to illuminate the membranous portion 43 of a subfield 44 but not the surrounding minor struts 41. The membranous portion 43 of the subfield includes the respective patterned region 45 surrounded by a respective non-patterned skirt 42. During exposure of a subfield 44, the respective skirt 42 prevents beam-shape errors and blanking-timing errors of the illumination beam 26 from adversely affecting the transfer-exposure of the subfield to the wafer 24.

The illumination beam 26 successively illuminates the respective patterned regions 45 of a row of subfields on the reticle 21 by appropriate lateral beam deflections within a controllable range. The corresponding imaging ("patterned") beam 28 is transferred onto the wafer surface by the projection-lens system 23. For each subfield in the row being exposed, the actual respective transfer position on the wafer is adjusted finely using the deflector 20 inside the projection-lens system 23, so that the portions corresponding to the minor struts 41 and skirts 42 on the reticle do not appear on the wafer 24. By carefully controlling operation of the deflector 20 in the projection-lens system 23 with respective movements of the reticle stage 22 and wafer stage 25 (in the figure, in the forward and rearward directions perpendicular to the beam-deflection directions), the individual subfield images as formed on the wafer 24 are "stitched" together to form a contiguous two-dimensional pattern on the wafer. After all subfields in a row are exposed (taking into account the limitations imposed by the size of the reticle 21 and respective ranges of stage movement), the reticle stage 22 and wafer stage 25 move in mutually opposite directions along a dimension perpendicular to the directions of stage movement during exposure to position the next row of subfields for exposure.

Figure 4:
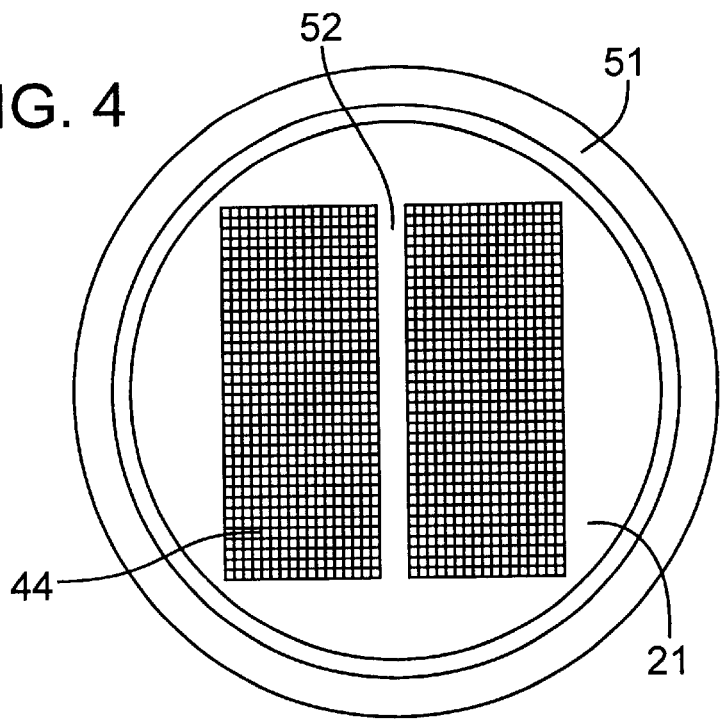
FIG. 4 is a planar view of a reticle such as that shown in FIG. 3.

A representative reticle 21 is shown in FIG. 4. The reticle 21 is formed, by way of example, from a silicon wafer having a diameter of 200 mm. To provide ease of wafer handling, improved accuracy and precision of wafer-conveying, and reduced wafer bending whenever the reticle is mounted on different reticle stages, the reticle 21 includes a supporting frame 51. Also, to increase the rigidity of the overall reticle structure, the reticle also may include one or more relatively wide major struts 52 extending between and separating major portions of the reticle.

Figure 5:
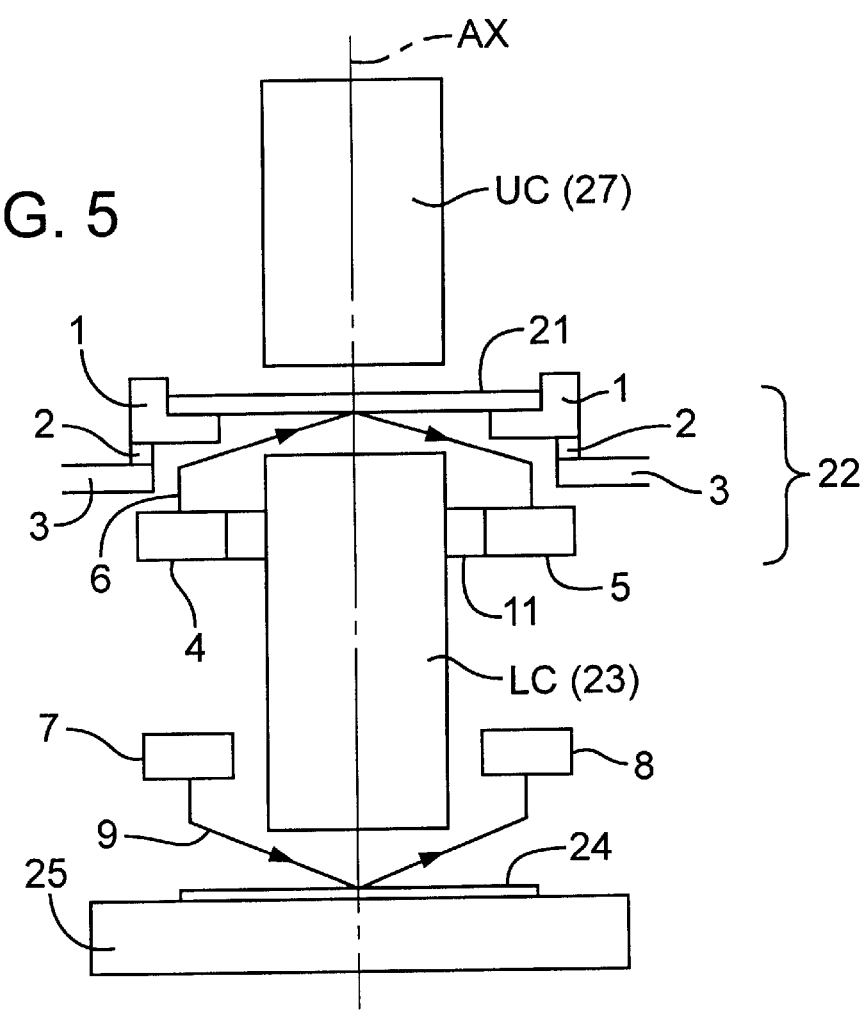
FIG. 5 is an elevational schematic view of a CPB apparatus, according to the invention, including a reticle-focus-detection device according to the invention.

Reference now is made to FIG. 5. For exposure, a wafer 24 is placed on the wafer stage 25 and a reticle 21 is placed on the reticle stage 22. A focus-detection beam 9 produced by a light-emitting system 7 is directed to be incident on the wafer 24 at an inclined angle. Light of this beam reflected from the wafer surface is detected by a light-receiving system 8. In response to focus and positional data provided by the detected beam 9, controlled vertical (axial) and tilt movements (relative to the optical axis AX) of the wafer stage 25 are made by actuators (not shown) located in at least three places beneath the stage 25. Hence, the wafer 24 is provided with an "auto-focus" detection scheme.

Wafer auto-focus detection normally is performed photoelectrically. According to this principle, the focus-detection beam 9 is caused to vibrate on a slit situated upstream of the light-receiving system 8. Vibration of the beam is achieved by reflecting the beam 9 from a vibrating mirror (not shown, but vibrating at a frequency of, e.g., several kHz). Hence, a light beam vibrating at twice the vibrational period of the mirror is detected to determine a position of best focus. I.e., as the focus-detection beam is caused, by reflection from a mirror vibrating at a frequency f, to sweep over a slit, the beam sweeps over the slit twice per each back and forth movement of the mirror. One forward movement the mirror (constituting a half swing) produces one output from the light-receiving system, and one backward movement of the mirror produces one output from the light-receiving system. Therefore, the frequency of the output signal is twice the frequency of mirror vibration. This same technique can be exploited with the reticle auto-focus detection scheme.

Figure 6:
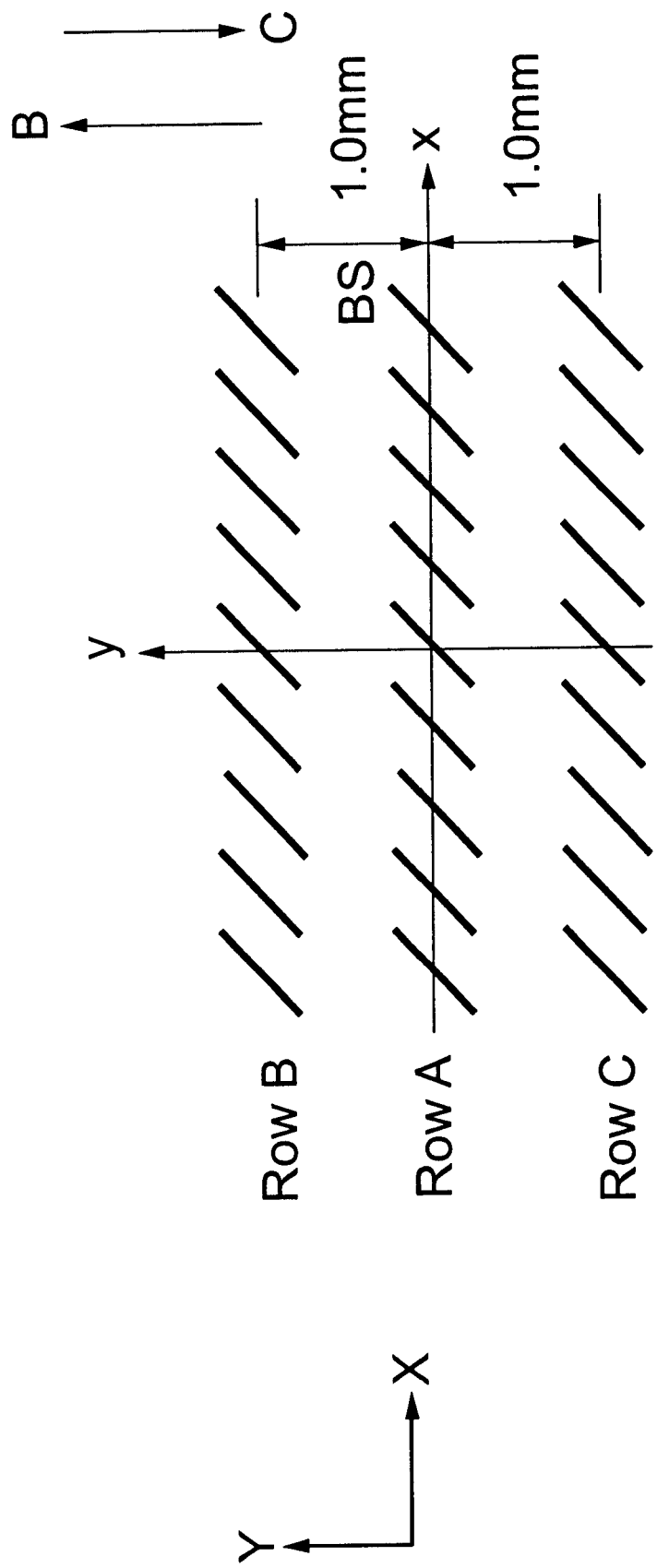
FIG. 6 is a planar view showing an exemplary arrangement of focus-detection beams as usable for detecting reticle "focus" (i.e., reticle axial height position).

To accommodate the continuously scanning movement of the wafer stage 25 during exposure, one-dimensional multi-point beams are arranged in a plurality of rows (three rows A, B, C of beam points shown in FIG. 6). To produce the multiple beams, the light-emitting system 7 is provided with a corresponding slit array and a lens system that produce, from a single light beam, multiple parallel beams of light of a defined size and having a defined spacing. One row of beam points (row B in FIG. 6) is used for the feed-forward of data concerning wafer indentation and projection during stage scanning in a first direction. Another row (the middle row, row A in FIG. 6) is used for servo control of reticle axial height correction as effected by actuators 2 shown in FIG. 5 (as well as of other imaging corrections such as focus, rotation, and magnification). The remaining row (row C in FIG. 6) is used for feed-forward of data concerning wafer indentation and inclination during stage scanning in a second direction opposite the first direction. In "feed-forward," pre-exposure information is obtained on wafer indentation and inclination by comparing, for example, the respective axial heights of two rows before exposing a subfield in the first of the rows. "Indentation" of a wafer pertains to surface topography features that result in the wafer surface not being planar. Detection of indentation normally is required before exposing a corresponding region on the wafer, so as to obtain the best resolution. The Y-direction in the figure is the direction of movement of the wafer stage 25. Whenever the wafer stage 25 moves in the direction indicated by the arrow B, row B is used for feed-forward; and whenever the wafer stage 25 moves in the direction indicated by the arrow C, row C is used for feed-forward.

In FIG. 6, the 45-degree tilt of the beam points is effective for detecting focus of a region of the wafer on which the pattern already has been formed. Usually, a pattern on the wafer includes horizontal lines as well as vertical lines, along with some indentation. If the beam points were oriented exactly vertically, then focus information obtained from a patterned region of the wafer would not be entirely correct due to effects of indentation. A similar error would arise if all the beam points were oriented exactly horizontally. Hence, the 45-degree tilt.

The "beam spacing" BS of the rows is determined by factors such as the flatness (planarity) of the wafer 24 and the inclination of the wafer stage 25 relative to the optical axis AX (FIG. 5). (I.e., respective degrees of indentation and inclination can be obtained from axial-height data obtained using the row B and row C beams. Beam spacing is determined taking surface roughness into consideration.) In the present example, the beam spacing BS is set at 1 mm. Residual controllable differences (residual errors left after making corrections using, for example, piezo-electric actuators to adjust wafer position) are controlled by the dynamic focus control of the projection-lens system 23, in addition to the reticle-focus-tracking error described later.

Referring further to FIG. 5, "UC" denotes an upper column containing the illumination-optical system 27 and an electron gun (serving as the source of the illumination beam). "LC" denotes a lower column containing the projection-lens system 23. The reticle 21 is mounted on the reticle stage 22 that includes a stage plate 1 supported relative to a base 3 by vertical actuators 2. The actuators 2 are located actually in three different places between the plate 1 and the base 3 to permit vertical and tilting control of the reticle stage 22. Exemplary actuators 2 are piezoelectric elements. Item 6 is a second focus-detection beam (specifically a reticle-position-measurement beam) having an inclined angle of incidence to the reticle 21. The reticle-focus-detection beam 6 is produced by a light-emitting system 4 and detected (after reflecting from the reticle 21) by a height detector 5 that receives the reticle-focus-detection beam.

During operation, the projection-lens system 23 generates heat from passage of electrical energy through various coils of the constituent lenses. Ordinarily, the lower column LC is cooled to avoid performance drift of the projection-lens 23 from thermal expansion. Accordingly, it is desirable that the light-emitting system 4 and the height detector 5 be attached to the lower column by coupling members 11 made of a low-thermal-expansion material (e. g., "Zerodur").

As will be understood readily by persons skilled in the relevant art, at least the reticle 21, reticle stage 22, lower part of the upper column UC, and upper part of the lower column LC are contained inside a vacuum chamber (not shown). The reticle-focus-detection beam 6 emitted from the light-emitting system 4 is transmitted into the vacuum chamber through a window (not shown) attached to a flange on the vacuum chamber.

The height detector 5 includes a light-receiving surface including a light sensor. The light sensor can be any suitable device that can detect and measure the position of the reticle-focus-detection beam 6 incident on the light-receiving surface 5. For example, the light sensor can be a CCD comprising a one- or two-dimensional array of light-sensitive pixels, a sensor of which the light-sensitive portion simply is split into two portions (each requiring a respective driver), or a PSD (position-sensitive-detector) in which the light-sensitive portion is not split, but position information is obtained nevertheless. Any of these configurations fills the following need: the reticle-focus-detection beam 6 emitted from the light-emitting system 4 is reflected by the reticle 21. If the "height" (axial position) of the reticle 21 relative to the projection-lens system 23 varies, then the beam 6 reflected from the reticle 21 exhibits a lateral deviation from the specified trajectory of the beam 6. This lateral deviation is detected as a corresponding change in the position at which the light 6 is incident on the light-receiving surface of the height detector 5.

Further regarding the reticle auto-focus aspect of the invention, a portion of the light output from an LED or halogen lamp (wavelength within the range of visible to infrared light, i.e., approximately 600 to 900 nm) is used to form the reticle-focus-detection beam 6. These exemplary sources are sufficient for providing a quantity of reflected light even for silicon-type reticle materials. Individual focus-detection beams are produced by passing the beam from the source simultaneously through multiple slits or other suitable openings. The number of beams can vary, and depends on the required accuracy with which the axial height position detection is to be performed, and on the number of subfields in a row. For some applications, the number of beams can correspond to the number of subfields in a row so that the axial height position of each subfield can be detected without changing the beam-irradiation position. The beams are shaped by a lens system (not shown) to have individual beam diameters of approximately 0.05 mm immediately before the beams strike the reticle. Hence, when the beams strike the reticle, the resulting beam spots on the reticle are shaped as ellipses each having a minor axis length of 0.05 mm.

The reticle auto-focus mechanism must be usable with a stencil-type reticle. I.e., a narrow light beam impinging on the reticle at a feature-defining aperture will pass at least partly through the aperture. Consequently, it is desirable that locations on the reticle impinged by the beams be on the membrane side of the minor struts 41 because these regions include no apertures. Also, to ensure that locations impinged by the beams are at minor strut positions regardless of any vertical movement of the reticle, it is desirable that the orientation of beam incidence be in a direction along which the minor struts extend across the reticle.

Figure 7A:
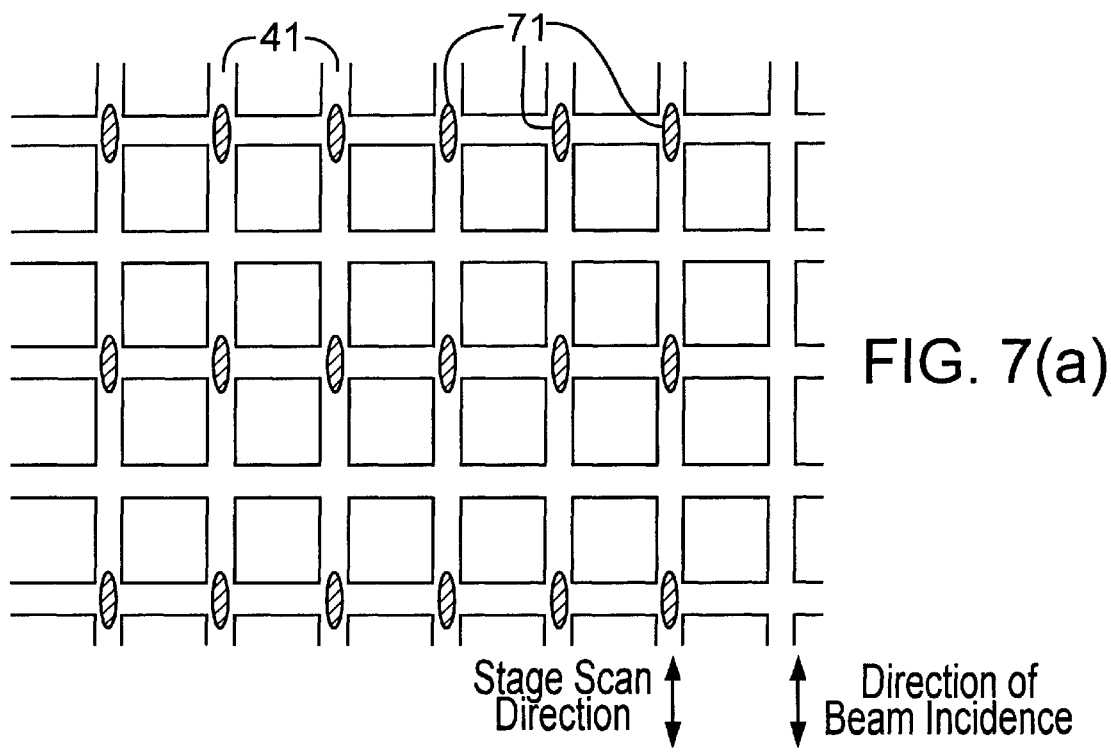
FIGS. 7(a)–7(b) are respective planar views showing, according to a representative embodiment, impingement of reticle-focus-detection beams on the reticle in respective regions of the reticle membrane along which minor struts extend.

An example of this is shown in FIG. 7(a), in which reticle-focus-detection beams 71, indicated by the shaded ellipses, are arranged in three rows as incident on the reticle. In the direction of stage scanning, each row of ellipses extends along a respective minor strut 41 separated by a non-illuminated minor strut from the next illuminated minor strut 41. Note that the direction of beam incidence also is in the stage-scan direction (downward or upward in the figure). In the FIG. 7(a) example, the beams always are incident on minor struts 41. This allows the beams (reflected from the reticle) to be detected regardless of vertical movement of the reticle.

The reticle of FIG. 7(a) is representative for use in CPB microlithography in which a reticle pattern is transferred one subfield at a time while deflecting the illumination beam left and right (in the figure) within a controlled range, as described above. In such a scheme, the illumination beam is blanked between each subfield.

Figure 7B:
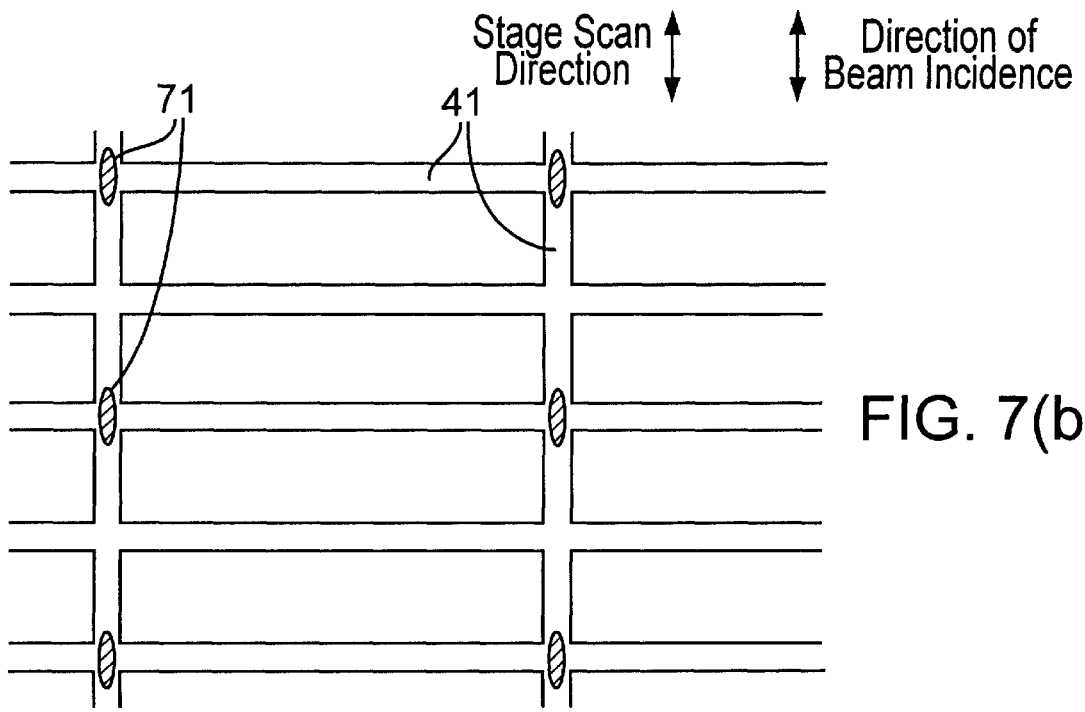

Alternatively, the reticle pattern may be transferred while scanning the beam in a direction perpendicular to the stage-scanning direction without blanking the beam. FIG. 7(b) illustrates a representative reticle used in such an instance, and also shows a representative manner in which rows of focus-detection beams 71 are incident on such a reticle. In this scheme, however, since the number of minor struts 41 extending in the vertical direction in the figure (stage-scanning direction) is small, it may be difficult to apply a sufficient number of beams 71 to the reticle.

Figure 8A:
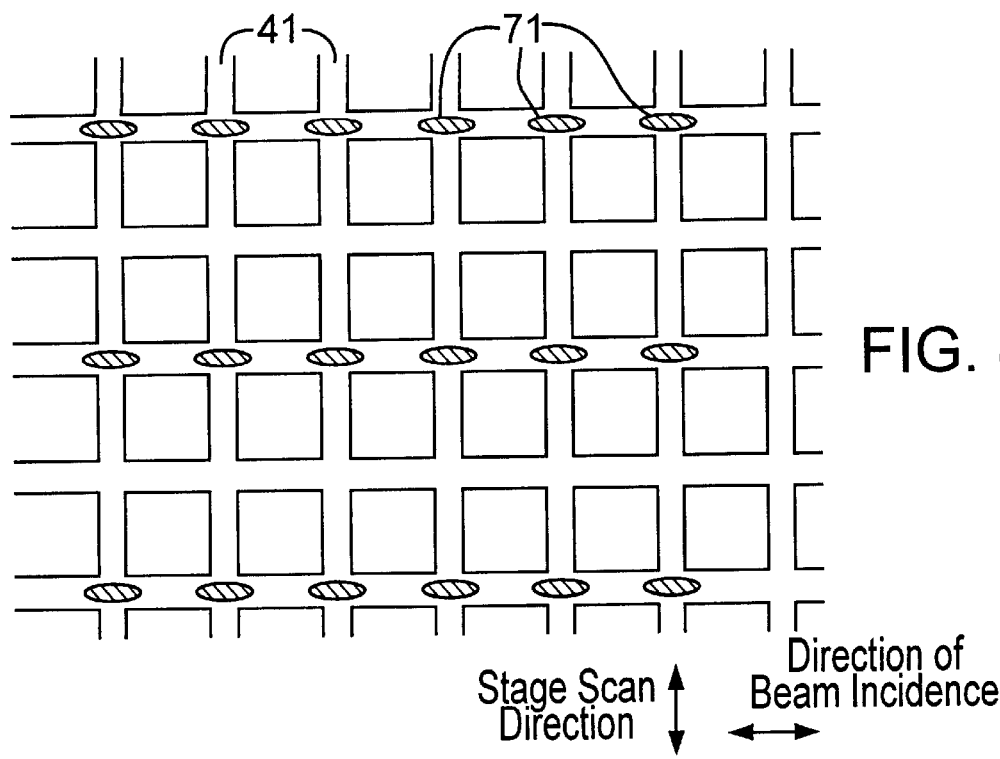
FIGS. 8(a)–8(b) are respective planar views that are similar to FIGS. 7(a)–7(b), respectively, except that the incident focus-detection beams in FIGS. 8(a)–8(b) extend in directions rotated 90 degrees from the directions shown in FIGS. 7(a)–7(b), respectively.
Figure 8B:
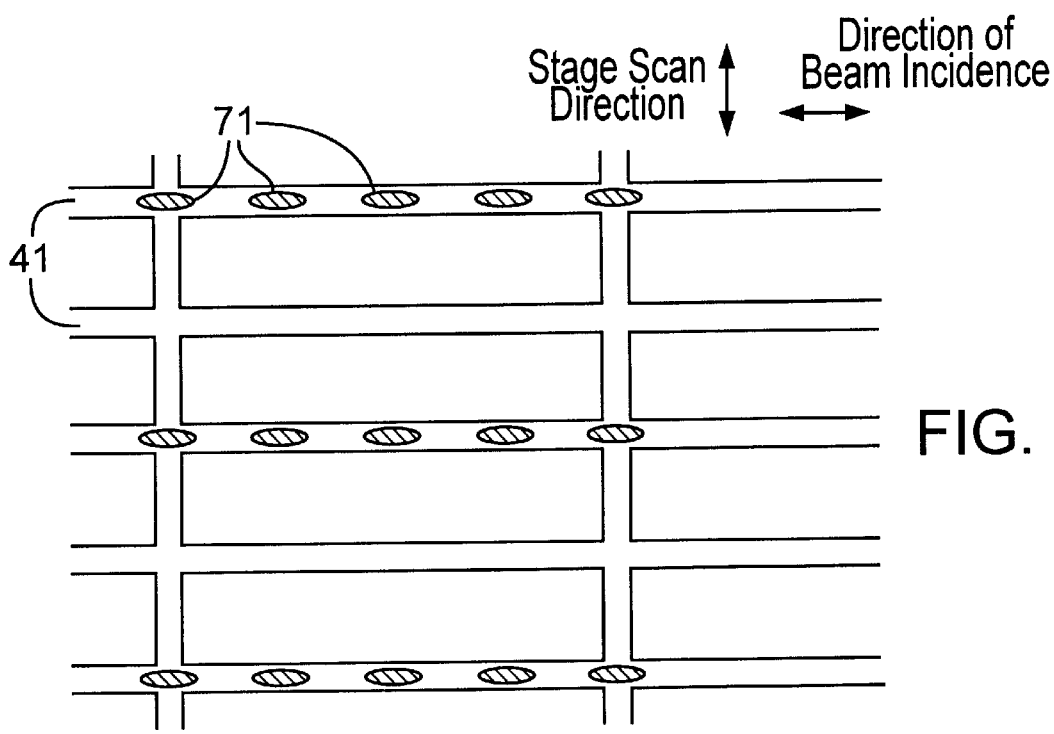

A way of solving this problem is shown in FIGS. 8(a) and 8(b), in which the orientation of beam incidence is in directions perpendicular to the stage-scanning direction (i.e., left to right in the figure). As depicted in FIGS. 8(a)–8(b), a sufficient number of beams 71 are incident on the minor struts 41 to ensure accurate positional detection. However, as the stages move in the indicated stage-scanning directions, the beams 71 (or portions thereof) may be reflected by the stenciled portions of the reticle membrane, resulting in erroneous positional detection. To avoid this problem, detections can be timed to occur only whenever the beams 71 are incident on minor struts 41 as shown.

For detecting the reflected beams 71, one-dimensional light sensor arrays (e.g., one-dimensional CCDs) can be used, each corresponding to an individual one-dimensional multi-point beam. Alternatively, a two-dimensional light sensor array (e.g., a two-dimensional CCD) can be used that simultaneously detects the multiple one-dimensional multi-point beams. Whichever type of light sensor employed for situations in which reticle-position measurements are performed using one-dimensional multi-point beams arranged in multiple rows, it is housed in the height detector 5.

Finally, as an example of focus control, reticle-focus detection can be performed using the output of the light-receiving sensor as it detects incoming focus-detection beams. The output is fed back to a control system (not shown) to achieve control of the vertical actuators 2 by the control system. If any residual focus variability is detected, the focus of the projection-lens system 23 in the lower column LC can be tracked by a dynamic-focus controller (as known in the art) that controls the electric current flowing through one or more coils in the projection-lens assembly. For control purposes, an output signal from the height detector 5 of the reticle-focus detector and an output signal from the light-receiving system 8 of the wafer-focus detector are received by a height analyzer and controller. The respective positions of the stages 22, 25 are obtained from distance-measuring interferometers (not shown but well understood in the art) associated with the stages. From such data, during exposure of a subfield on the reticle 21, the magnitude and direction of correction required for the subfield, and the magnitude and direction of wafer-focus correction are determined. (The determinations are made from the output signal from the height detector that detects axial height positions from lateral displacements of the slit images, as discussed above.) Actuator control of both the reticle and the wafer, and dynamic-focus coil control of the electron-beam optical system, are performed (by changing lens and deflector excitation parameters) on the basis of the output from correction calculations. Correction amounts are calculated as total correction as well as corrections that can be performed mechanically (e.g., using the vertical actuators). Voltages applied to the vertical actuators and height-correction amounts are calibrated. Also, changes in lens and deflector excitation currents, as well as focus changes are calibrated before beginning operation of the microlithography apparatus.

Hence, according to the invention, reticle-focus-detection devices and methods are provided for use in CPB microlithography. The reticle-focus-detection device provides an array of multiple focus-detection beams that are incident at an oblique angle on the reticle. Light of the beams reflected from the reticle is detected by a sensor operable to determine respective positions of the reflected beams. From the resulting beam-position data, data is obtained regarding the axial height position of the reticle relative to the projection-lens system. Obtaining of the reticle-position data can be synchronized so that the data is obtained only whenever minor struts of the reticle are coincident with the respective positions of the focus-detection beams. Such synchronization prevents erroneous position signals that otherwise might be produced whenever the reticle is a stencil reticle. As the beams are reflected from the reticle, variations in axial height position of the reticle relative to the projection-lens system are detected as variations in the positions of the beams as incident on the sensor. To such end, the sensor can be split into multiple portions (configured as a two-dimensional sensor) or can be a one-dimensional (linear) sensor. The reticle-focus detection can be performed at high speed and with high stability regardless of the direction of movement of the reticle stage.

Whereas the invention has been described in connection with a preferred embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A charged-particle-beam (CPB) microlithography apparatus, comprising:

an illumination-optical system situated and configured to illuminate a region of a pattern-defining reticle with a charged-particle illumination beam passing through the illumination-optical system, the reticle comprising a reticle membrane and support struts extending from non-pattern-defining regions of the reticle membrane;

a projection-optical system situated and configured to projection-transfer an image of the illuminated region of the reticle onto a corresponding region of a sensitive substrate using an imaging beam passing through the projection-optical system; and a reticle-focus-detection device situated and configured to detect an axial height position of the reticle relative to the projection-lens system, the reticle-focus-detection device comprising a focus-detection-beam source situated and configured to produce multiple focus-detection light beams and to direct the focus-detection beams onto a surface of the reticle such that the focus-detection beams are incident on the non-pattern-defining regions of the reticle membrane at an oblique angle of incidence, and a height detector situated and configured to detect light, of the focus-detection beams, reflected from the reticle surface and to produce corresponding focus-detection signals.

2. The apparatus of claim 1, wherein the reticle-focus-detection device is configured to detect an axial height position of a stencil reticle relative to the projection-lens system.

3. The apparatus of claim 1, wherein the reticle-focus-detection device is configured to detect an axial height position of a scattering-membrane reticle relative to the projection-lens system.

4. The apparatus of claim 1, wherein the reticle-focus-beam source is configured to direct the focus-detection beams to the reticle, and the height detector is configured to produce the focus-detection signal, only whenever the non-pattern-defining regions of the reticle membrane are being illuminated by the focus-detection beams.

5. The apparatus of claim 1, wherein:

the height detector comprises a light-receiving surface; and the height detector is configured to measure respective lateral displacements of the focus-detection light beams on the light-receiving surface.

6. The apparatus of claim 5, wherein the height detector comprises a light sensor selected from the group consisting of one-dimensional light-sensor arrays, two-dimensional light-sensor arrays, and point-sensitive detectors.

7. A charged-particle-beam (CPB) microlithography apparatus, comprising:

an illumination-optical system situated and configured to illuminate a region of a pattern-defining reticle with a charged-particle illumination beam passing through the illumination-optical system;

a projection-optical system situated and configured to projection-transfer an image of the illuminated region of the reticle onto a corresponding region of a sensitive substrate using an imaging beam passing through the projection-optical system;

a reticle-focus-detection device situated and configured to detect an axial height position of the reticle relative to the projection-lens system; and a reticle stage to which the reticle is mounted and a substrate stage to which the substrate is mounted for exposure, wherein the reticle stage and substrate stage are moved in opposite directions during exposure of the reticle pattern onto the substrate.

8. The apparatus of claim 7, wherein the focus-detection-beam source is configured to produce multiple focus-detection light beams directed at the reticle surface.

9. In a method for performing projection-transfer of a pattern, defined on a reticle, to a sensitive substrate using a charged particle beam, the reticle comprising a reticle membrane and support struts extending from non-pattern-defining regions of the reticle membrane, wherein the reticle is illuminated with a charged particle illumination beam to produce an imaging beam, and the imaging beam is passed through a projection-lens system to the substrate, a method for detecting a focus condition of the reticle, the method comprising:

(a) providing multiple focus-detection beams of light directed at an oblique angle of incidence to a surface of the reticle such that the focus-detection light beams are incident on the non-pattern-defining regions of the reticle membrane, thereby producing respective reflected beams;

(b) detecting the reflected beams using a height detector configured to produce corresponding detection signals from the detected light beams; and (c) processing the detection signals to produce data concerning an axial height position of the reticle relative to the projection-lens system.

10. The method of claim 9, wherein steps (a) and (b) are performed only whenever the non-pattern-defining regions of the reticle membrane are being illuminated by the focus-detection beams.

* * * * *

UNITED STATES PATENT AND TRADEMARK OFFICE
CERTIFICATE OF CORRECTION

PATENT NO.     : 6,621,089 B1
DATED          : September 16, 2003
INVENTOR(S)    : Kazuaki Suzuki It is certified that error appears in the above-identified patent and that said Letters Patent is hereby corrected as shown below:

Column 1,
Line 20, "substrate;" should be -- substrate. --.

Column 5,
Line 36, "Representative Embodiment" should be -- First Representative Embodiment --.

Column 7,
Line 20, "movement the" should be -- movement of the --.

Column 8,
Line 33, "projection-lens 23" should read -- projection-lens system 23 --.

Signed and Sealed this

Thirtieth Day of December, 2003

JAMES E. ROGAN
*Director of the United States Patent and Trademark Office*